United States Patent
Gong (10) Patent No.: US 10,302,985 B1
(45) Date of Patent: May 28, 2019

(54) GOA CIRCUIT, LIQUID CRYSTAL PANEL AND DISPLAY DEVICE

(71) Applicant: Wuhan China Star Optoelectronics Technology Co., Ltd., Wuhan, Hubei (CN)

(72) Inventor: Qiang Gong, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/749,303

(22) PCT Filed: Jan. 2, 2018

(86) PCT No.: PCT/CN2018/070020
§ 371 (c)(1),
(2) Date: Jan. 31, 2018

(30) Foreign Application Priority Data

Nov. 28, 2017 (CN) .......................... 2017 1 1217027

(51) Int. Cl.
*G09G 3/36* (2006.01)
*G02F 1/1333* (2006.01)
*H01L 27/12* (2006.01)
*G06F 3/041* (2006.01)
*G02F 1/133* (2006.01)

(52) U.S. Cl.
CPC ...... *G02F 1/13338* (2013.01); *G02F 1/13306* (2013.01); *G06F 3/0412* (2013.01); *G09G 3/36* (2013.01); *H01L 27/1214* (2013.01); *G09G 2310/0264* (2013.01)

(58) Field of Classification Search
CPC ............. G02F 1/13338; G02F 1/13306; G06F 3/0412; H01L 27/1214; G09G 3/36; G09G 2310/0264
See application file for complete search history.

(56) References Cited

U.S. PATENT DOCUMENTS

| | | | |
|---|---|---|---|
| 2016/0034097 A1* | 2/2016 | Chae ................. | G06F 3/044 345/173 |
| 2016/0335962 A1* | 11/2016 | Xiao ................. | G09G 3/36 |
| 2016/0358564 A1* | 12/2016 | Xiao ................. | G09G 3/20 |
| 2016/0358572 A1* | 12/2016 | Xiao ................. | G11C 19/287 |
| 2017/0010731 A1* | 1/2017 | Zhang ............... | G11C 19/28 |
| 2017/0200419 A1* | 7/2017 | Ma .................... | G09G 3/3266 |

* cited by examiner

*Primary Examiner* — Premal R Patel
(74) *Attorney, Agent, or Firm* — Hauptman Ham, LLP (57) ABSTRACT

A GOA circuit comprises a plurality of GOA structural units connected in cascade, and each GOA structural unit outputs a line scanning signal to a corresponding one line of pixel units. An Nth stage GOA structural unit comprises a forward-reverse scan control module, a node signal control input module, an output control module, a voltage-stabilizing module, a node Q pull-down module, a node P pull-down module, a gate signal pull-down module, a GAS signal function module and a self-lifting capacitor. A gate of a first TFT of the voltage-stabilizing module receives a third GAS signal, a source thereof is connected to the forward-reverse scan control module and the node Q pull-down module, and a drain thereof is connected to the first node. The third GAS signal is VGH signal during the scan period of the touch panel, and is a VGL signal in a suspending period of the touch panel.

20 Claims, 3 Drawing Sheets

GOA CIRCUIT, LIQUID CRYSTAL PANEL AND DISPLAY DEVICE

RELATED APPLICATIONS

The present application is a National Phase of International Application Number PCT/CN2018/070020, filed on Jan. 2, 2018, and claims the priority of China Application No. 201711217027.6, filed on Nov. 28, 2017.

FIELD OF THE DISCLOSURE

The disclosure relates to a liquid crystal display technical field, and more particularly to a GOA (Gate Driver On Array) circuit, liquid crystal panel and display device.

BACKGROUND

GOA technique drives scanning on a liquid crystal panel by forming a gate line scan driving signal circuit on an array substrate through the existed thin film transistor liquid crystal display device array process. Compared with the conventional COF (Chip On Flex/Film) technique, the GOA technique could greatly save the manufacturing cost, save the bonging process of the COF on the Gate side, and increase the producing performance. Therefore, GOA is an important technique in the future development of the liquid crystal panel.

Along with the development of the low temperature polysilicon (LTPS) semiconductor transistors and due to the very high carrier mobility of the LTPS semiconductors, corresponded integrated peripheral circuits of the panel and researches relating to the system on panel (SOP) techniques are focused by people and are become reality step by step.

At present, due to the well-development of integrated In-Cell Touch panel technology, it is widely used in high-end mobile phones. In the integrated touch panels, since the display refreshing time is separated, the panels usually perform touch scanning within a keeping time (i.e., touch panel suspending time), so that the working status of the GOA circuit of the panel is no longer continuous. Therefore, a certain number of stages are scanned continuously, the scan status is kept for a period of time after the scan, and then another scan starts to continue to scan the rest stages. However, when the GOA circuit is in the keeping status, the problem of insufficient circuit maintenance capability happens easily, so that the cascaded transmission of the GOA circuit might fail and the display abnormality occurs.

Therefore, there is an urgent need for an improved GOA circuit to overcome the problem of insufficient circuit maintenance capability so that failure of cascaded transmission of the GOA circuit could be reduced and the circuit could be more stable.

SUMMARY

The technique issue to be solved by the embodiments of the present invention is to provide a GOA circuit, liquid crystal panel and display device to overcome the problem of insufficient circuit maintenance capability so that failure of cascaded transmission of the GOA circuit could be reduced and the circuit could be more stable.

In order to solve the technique issue mentioned above, one embodiment of the present invention provides a GOA circuit. The GOA circuit comprises a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first thin film transistor (TFT), wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

Wherein, the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

Wherein, the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

Wherein, the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

Wherein, the node Q pull-down module comprises an eighth TFT, and a gate of the eighth TFT is connected to the second node, a source of the eighth TFT receives the signal with the constant low-level potential, and a drain of the eighth TFT is connected to the source of the first TFT of the voltage-stabilizing module and is connected to the first node through the first TFT.

Wherein, the node P pull-down module comprises a ninth TFT, and a gate of the ninth TFT is connected to both the drains of the second TFT and the third TFT of the forward-reverse scan control module, a source of the ninth TFT receives the signal with the constant low-level potential, and a drain of the ninth TFT is connected to the second node.

Wherein, the gate signal pull-down module comprises a tenth TFT, and a gate of the tenth TFT is connected to the second node, a source of the tenth TFT receives the signal with the constant low-level potential, and a drain of the tenth TFT receives the current-stage gate driving signal of the Nth stage GOA structural unit.

Wherein, the GAS signal function module comprises an eleventh TFT, a twelfth TFT and a thirteenth TFT; wherein, a gate of the eleventh TFT receives the first GAS signal, a source of the eleventh TFT receives the signal with the constant low-level potential, and a drain of the eleventh TFT is connected to the second node;

a gate of the twelfth TFT receives the first GAS signal and is short-connected to a source of the twelfth TFT, and a drain of the twelfth TFT receives the current-stage gate driving signal of the Nth stage GOA structural unit;

a gate of the thirteenth TFT receives the second GAS signal, a source of the thirteenth TFT receives the signal with the constant low-level potential, and a drain of the thirteenth TFT receives the current-stage gate driving signal of the Nth stage GOA structural unit.

Correspondingly, one embodiment of the present invention further provides a liquid crystal panel. The liquid crystal panel comprises a GOA circuit. The GOA circuit comprises a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first TFT, wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

Wherein, the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

Wherein, the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

Wherein, the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

Wherein, the node Q pull-down module comprises an eighth TFT, and a gate of the eighth TFT is connected to the second node, a source of the eighth TFT receives the signal with the constant low-level potential, and a drain of the eighth TFT is connected to the source of the first TFT of the voltage-stabilizing module and is connected to the first node through the first TFT.

Wherein, the node P pull-down module comprises a ninth TFT, and a gate of the ninth TFT is connected to both the drains of the second TFT and the third TFT of the forward-reverse scan control module, a source of the ninth TFT receives the signal with the constant low-level potential, and a drain of the ninth TFT is connected to the second node.

Wherein, the gate signal pull-down module comprises a tenth TFT, and a gate of the tenth TFT is connected to the second node, a source of the tenth TFT receives the signal with the constant low-level potential, and a drain of the tenth TFT receives the current-stage gate driving signal of the Nth stage GOA structural unit.

Wherein, the GAS signal function module comprises an eleventh TFT, a twelfth TFT and a thirteenth TFT; wherein, a gate of the eleventh TFT receives the first GAS signal, a source of the eleventh TFT receives the signal with the constant low-level potential, and a drain of the eleventh TFT is connected to the second node;

a gate of the twelfth TFT receives the first GAS signal and is short-connected to a source of the twelfth TFT, and a drain of the twelfth TFT receives the current-stage gate driving signal of the Nth stage GOA structural unit;

a gate of the thirteenth TFT receives the second GAS signal, a source of the thirteenth TFT receives the signal with the constant low-level potential, and a drain of the thirteenth TFT receives the current-stage gate driving signal of the Nth stage GOA structural unit.

Correspondingly, one embodiment of the present invention further provides a display device. The display device comprises a liquid crystal panel. The liquid crystal display panel comprises a GOA circuit, wherein, the GOA circuit comprises a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first TFT, wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

Wherein, the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

Wherein, the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

Wherein, the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

In the embodiments of the present invention, through setting the signal, which is received by the gate of the first TFT of the voltage-stabilizing module of each stage of the GOA structural units in the GOA circuit, to be the third GAS signal which is at the constant high-level potential VGH during the scan period of the touch panel and at the constant low-level potential VGL during the suspending period of the touch panel, the voltage-stabilizing module is prevented from being turned on during the suspending period of the touch panel and current leakage from the first node Q to the constant low-level potential VGL through the node Q pull-down module or from the first node Q to the low-level potential of the corresponded direct-current scan control signal through the forward-reverse scan control module could be stopped, so that normally turning on the output control module and fully turning on the next stage GOA structural unit after the suspending period of the touch panel could be ensured. Therefore, the problem of insufficient circuit maintenance capability could be overcome, failure of cascaded transmission of the GOA circuit could be reduced and the circuit could be more stable.

BRIEF DESCRIPTION OF THE DRAWINGS

In order to make the descriptions of the technique solutions of the embodiments of the present invention or the existed techniques, the drawings necessary for describing the embodiments or the existed techniques are briefly introduced below. Obviously, the drawings described below are only some embodiments of the present invention, and, for those with ordinary skill in this field, other drawings can be obtained from the drawings described below without creative efforts.

DETAILED DESCRIPTION OF PREFERRED EMBODIMENTS

The embodiments of the present invention will be described with reference to accompanying drawings as follows.

In the first embodiment of the present invention, a GOA circuit is provided. The GOA circuit comprises a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units. In order to simplify the description, the Nth stage GOA structural unit is used as an example for explanation, wherein N is a positive integer.

Figure 1:
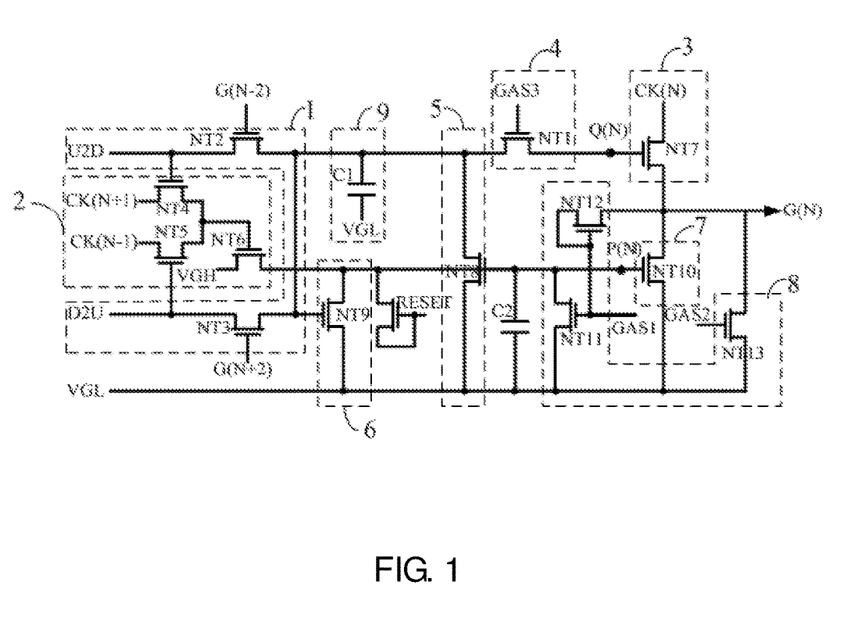
FIG. 1 is a circuit diagram of one stage GOA structural unit of the GOA circuit according to one embodiment of the present invention.

As shown in FIG. 1, the Nth stage GOA structural unit comprises:

a forward-reverse scan control module 1 for controlling the GOA circuit to scan forwardly or inversely by using a forward direct-current scan control signal U2D and a reverse direct-current scan control signal D2U;

a node signal control input module 2 for outputting a low-level potential in a non-working stage of the GOA circuit;

an output control module 3 for controlling output of a gate driving signal;

a voltage-stabilizing module 4 for maintaining a potential of a first node Q(N);

a node Q pull-down module 5 for pulling down the potential of the first node Q(N);

a node P pull-down module 6 for pulling down a potential of a second node P(N);

a gate signal pull-down module 7 for pulling down a potential of a current-stage gate driving signal G(N) and controlling output of the current-stage gate driving signal G(N) during a scan period of the touch panel;

a GAS signal function module 8 for turning on all gate driving signals of the GOA circuit and controlling output of the current-stage gate driving signal G(N) during the scan period of the touch panel by using a first GAS signal GAS1 and a second GAS signal GAS2; and a self-lifting capacitor 9 for a second lifting of the potential of the first node Q(N).

Wherein, the forward-reverse scan control module 1 comprises a second thin film transistor (TFT) NT2 and a third TFT NT3. A gate of the second TFT NT2 receives a current-stage gate driving signal G(N−2) of a (N−2)th stage GOA structural unit of the GOA structural units, a source of the second TFT NT2 receives the forward direct-current scan control signal U2D, and a drain of the second TFT NT2 is connected to both a source of a first TFT NT1 of the voltage-stabilizing module 4 and a drain of the third TFT NT3. A gate of the third TFT NT3 receives a current-stage gate driving signal G(N+2) of a (N+2)th stage GOA structural unit of the GOA structural units, and a source of the third TFT NT3 receives the reverse direct-current scan control signal D2U.

Wherein, the node signal control input module 2 comprises a fourth TFT NT4, a fifth TFT NT5 and a sixth TFT NT6. A gate of the fourth TFT NT4 receives the forward direct-current scan control signal U2D, a source of the fourth TFT NT4 receives a current-stage clock signal CK(N+1) of a (N+1)th stage GOA structural unit of the GOA structural units, and a drain of the fourth TFT NT4 is connected to a drain of the fifth TFT NT5 and a gate of the sixth TFT NT6. A gate of the fifth TFT NT5 receives the reverse direct-current scan control signal D2U, and a source of the fifth TFT NT5 receives a current-stage clock signal CK(N−1) of a (N−1)th stage GOA structural unit of the GOA structural units. A source of the sixth TFT NT6 receives the signal with the constant high-level potential VGH, and a drain of the sixth TFT NT6 is connected to the second node P(N) connected to the node Q pull-down module 5, the node P pull-down module 6, the gate signal pull-down module 7 and the GAS signal function module 8.

Wherein, the output control module 3 comprises a seventh TFT NT7. A gate of the seventh TFT NT7 is connected to the first node Q(N), a source of the seventh TFT NT7 receives a current-stage clock signal CK(N) of the Nth stage GOA structural unit, and a drain of the seventh TFT NT7 receives the current-stage gate driving signal G(N) of the Nth stage GOA structural unit.

Wherein, the voltage-stabilizing module 4 comprises the first TFT NT1. A gate of the first TFT NT1 receives a third GAS signal GAS3, a source of the first TFT NT1 is connected to both the forward-reverse scan control module 1 and the node Q pull-down module 5, and a drain of the first TFT NT1 is connected to the first node Q(N).

Wherein, the node Q pull-down module 5 comprises an eighth TFT NT8. A gate of the eighth TFT NT8 is connected to the second node P(N), a source of the eighth TFT NT8 receives the signal with the constant low-level potential VGL, and a drain of the eighth TFT NT8 is connected to the source of the first TFT NT1 of the voltage-stabilizing module 4 and is connected to the first node Q(N) through the first TFT NT1.

Wherein, the node P pull-down module 6 comprises a ninth TFT NT9. A gate of the ninth TFT NT9 is connected to both the drains of the second TFT NT2 and the third TFT NT3 of the forward-reverse scan control module 1, a source of the ninth TFT NT9 receives the signal with the constant low-level potential VGL, and a drain of the ninth TFT NT9 is connected to the second node P(N).

Wherein, the gate signal pull-down module 7 comprises a tenth TFT NT10. A gate of the tenth TFT NT10 is connected to the second node P(N), a source of the tenth TFT NT10 receives the signal with the constant low-level potential VGL, and a drain of the tenth TFT NT10 receives the current-stage gate driving signal G(N) of the Nth stage GOA structural unit.

Wherein, the GAS signal function module 8 comprises an eleventh TFT NT11, a twelfth TFT NT12 and a thirteenth TFT NT13. A gate of the eleventh TFT NT11 receives the first GAS signal GAS1, a source of the eleventh TFT NT11 receives the signal with the constant low-level potential VGL, and a drain of the eleventh TFT NT11 is connected to the second node P(N). A gate of the twelfth TFT NT12 receives the first GAS signal GAS1 and is short-connected to a source of the twelfth TFT NT12, and a drain of the twelfth TFT NT12 receives the current-stage gate driving signal G(N) of the Nth stage GOA structural unit. A gate of the thirteenth TFT NT13 receives the second GAS signal GAS2, a source of the thirteenth TFT NT13 receives the signal with the constant low-level potential VGL, and a drain of the thirteenth TFT NT13 receives the current-stage gate driving signal G(N) of the Nth stage GOA structural unit.

Wherein, the self-lifting capacitor 9 comprises a first capacitor C1. One terminal of the first capacitor C1 receives the signal with the constant low-level potential VGL, and another terminal of the first capacitor C1 is connected to the source of the first TFT NT1 of the voltage-stabilizing module 4 and connected to the first node Q(N) through the first TFT NT1, so as to perform second lifting of the potential of the first node Q(N).

Figure 2:
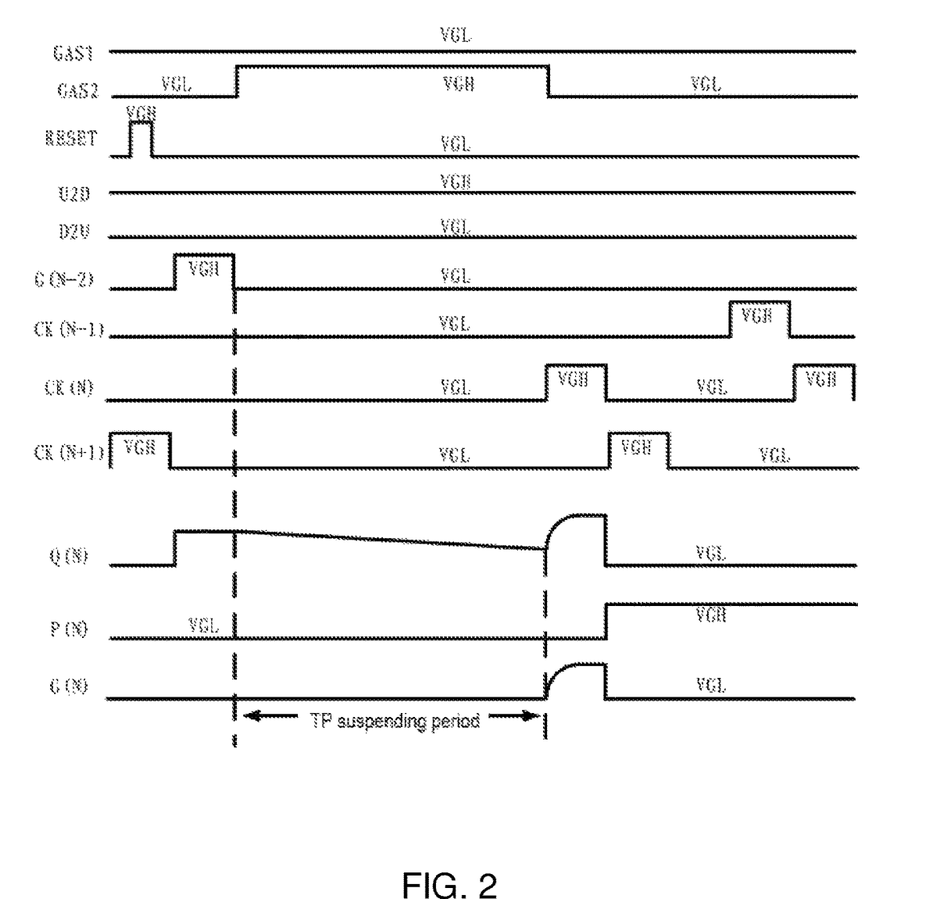
FIG. 2 is a timing chart when one stage GOA structural unit of the GOA circuit receives the signal with the constant high-level potential VGH according to one embodiment of the present invention.

It is found by the applicant that when the third GAS signal GAS3 received by the gate of the first TFT NT1 of the voltage-stabilizing module 4 is always kept being the signal with the constant high-level voltage VGH, the gate of the first TFT NT1 of the voltage-stabilizing module 4 would be kept at high-level potential and being turned on always once entering the suspending period of the touch panel so that charges would leak from the first node Q(N) to the constant low-level potential VGL through the source of the first TFT NT1 and the seventh TFT NT7 of the node Q pull-down module 5, or leak from the first node Q(N) to the forward direct-current scan control signal U2D or reverse direct-current scan control signal D2U at low-level potential through the source of the first TFT NT1 and the forward-reverse scan control module 1. Therefore, after the suspending period of the touch panel is finished, the potential of the first node Q(N) is too low to fully turn on the seventh TFT NT7 of the output control module 3 so that abnormal occurs in the current stage GOA structural unit and a next stage GOA structural unit next to the current stage GOA structural unit cannot be fully turned on. Please refer to FIG. 2 for the specific timing diagram. It is noted that, the potentials of the forward direct-current scan control signal U2D and the reverse direct-current scan control signal D2U are different at the same time, and the current leakage path of the first node Q(N) is determined in accordance with the scan direction of the forward-reverse scan control module 1. For example, when the forward-reverse scan control module 1 scans in forward direction, the forward direct-current scan control signal U2D is at high-level potential and the reverse direct-current scan control signal D2U is at low-level potential so that the charges are leaked from the first node Q(N) to the reverse direct-current scan control signal D2U. Or, when the forward-reverse scan control module 1 scans in reverse direction, the charges are leaked from the first node Q(N) to the forward direct-current scan control signal U2D.

Figure 3:
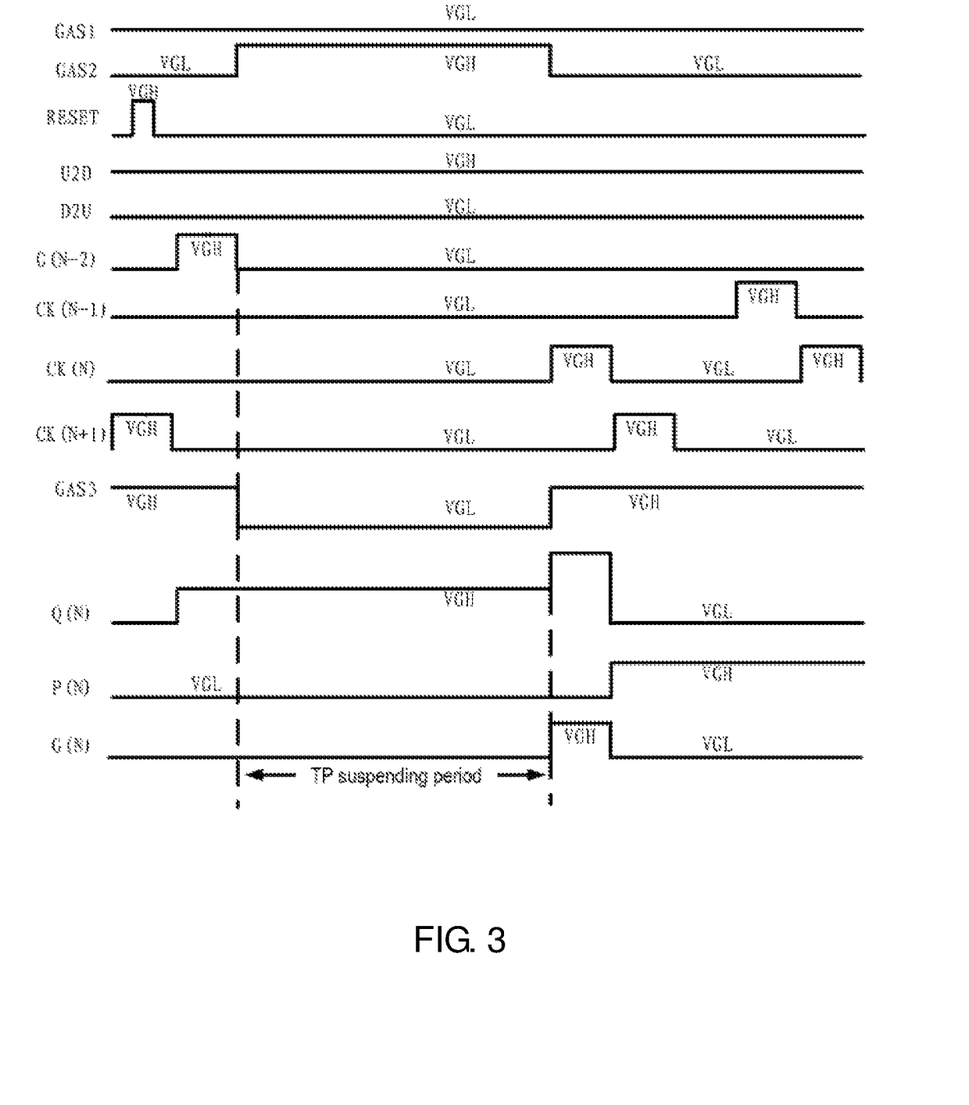
FIG. 3 is a timing chart of one stage GOA structural unit of the GOA circuit according to one embodiment of the present invention.

In order to overcome the problem of insufficient circuit maintenance capability so as to reduce failure of cascaded transmission of the GOA circuit and increase stability of the circuit, the present invention adjusts the third GAS signal GAS3 received by the gate of the first TFT NT1 of the voltage-stabilizing module 4 so that the third GAS signal GAS3 is kept being the signal with the constant high-level potential VGH during the scan period of the touch panel and being the signal with the constant low-level potential VGL during the suspending period of the touch panel. Therefore, the first TFT NT1 of the voltage-stabilizing module 4 could be terminated during the suspending period of the touch panel, and charge leakage from the first node Q(N) could be prevented. Please refer to FIG. 3 for the specific timing diagram.

In the first embodiment of the present invention, the TFT's used in the GOA structural units are N-type TFT's, the signal with the constant high-level potential VGH is set at 10V, and the signal with the constant low-level potential VGL is set at −7V. The potential of the forward direct-current scan control signal U2D is 10V when the forward direct-current scan control signal U2D is with high-level potential, and the potential of the forward direct-current scan control signal U2D is −7V when the forward direct-current scan control signal U2D is with low-level potential. Similarly, the potential of the reverse direct-current scan control signal D2U is −7V when the reverse direct-current scan control signal D2U is with low-level potential, and the potential of the reverse direct-current scan control signal D2U is 10V when the reverse direct-current scan control signal D2U is with high-level potential.

Corresponding to the GOA circuit provided by the first embodiment of the present invention, the second embodiment of the present invention provides a liquid crystal panel comprising the GOA circuit having structure and connecting relationship the same as the GOA circuit provided by the first embodiment of the present invention. The details could be referred to the related contents of the first embodiment of the present invention and are nod described again here.

Corresponding to the liquid crystal panel provided in the second embodiment of the present invention, the third embodiment of the present invention provides a display device comprising the liquid crystal panel having structure and connecting relationship the same as the liquid crystal panel provided by the second embodiment of the present invention. The details could be referred to the related contents of the second embodiment of the present invention and are nod described again here.

The beneficial effects obtained through adopting the embodiments of the present invention are as follows:

In the embodiments of the present invention, through setting the signal, which is received by the gate of the first TFT of the voltage-stabilizing module of each stage of the GOA structural units in the GOA circuit, to be the third GAS signal which is at the constant high-level potential VGH during the scan period of the touch panel and at the constant low-level potential VGL during the suspending period of the touch panel, the voltage-stabilizing module is prevented from being turned on during the suspending period of the touch panel and current leakage from the first node Q to the constant low-level potential VGL through the node Q pull-down module or from the first node Q to the low-level potential of the corresponded direct-current scan control signal through the forward-reverse scan control module could be stopped, so that normally turning on the output control module and fully turning on the next stage GOA structural unit after the suspending period of the touch panel could be ensured. Therefore, the problem of insufficient circuit maintenance capability could be overcome, failure of cascaded transmission of the GOA circuit could be reduced and the circuit could be more stable.

The foregoing contents are detailed description of the disclosure in conjunction with specific embodiments and the scope of the present invention should not be limited accordingly. For the person skilled in the art of the disclosure, without departing from the concept of the disclosure, simple deductions or substitutions can be made and should be included in the protection scope of the application.

What is claimed is:

1. A GOA (Gate Driver on Array) circuit, comprising a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first thin film transistor (TFT), wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

2. The GOA circuit according to claim 1, wherein the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

3. The GOA circuit according to claim 2, wherein the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

4. The GOA circuit according to claim 3, wherein the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

5. The GOA circuit according to claim 4, wherein the node Q pull-down module comprises an eighth TFT, and a gate of the eighth TFT is connected to the second node, a source of the eighth TFT receives the signal with the constant low-level potential, and a drain of the eighth TFT is connected to the source of the first TFT of the voltage-stabilizing module and is connected to the first node through the first TFT.

6. The GOA circuit according to claim 5, wherein the node P pull-down module comprises a ninth TFT, and a gate of the ninth TFT is connected to both the drains of the second TFT and the third TFT of the forward-reverse scan control module, a source of the ninth TFT receives the signal with the constant low-level potential, and a drain of the ninth TFT is connected to the second node.

7. The GOA circuit according to claim 6, wherein the gate signal pull-down module comprises a tenth TFT, and a gate of the tenth TFT is connected to the second node, a source of the tenth TFT receives the signal with the constant low-level potential, and a drain of the tenth TFT receives the current-stage gate driving signal of the Nth stage GOA structural unit.

8. The GOA circuit according to claim 7, wherein the GAS signal function module comprises an eleventh TFT, a twelfth TFT and a thirteenth TFT; wherein, a gate of the eleventh TFT receives the first GAS signal, a source of the eleventh TFT receives the signal with the constant low-level potential, and a drain of the eleventh TFT is connected to the second node;

a gate of the twelfth TFT receives the first GAS signal and is short-connected to a source of the twelfth TFT, and a drain of the twelfth TFT receives the current-stage gate driving signal of the Nth stage GOA structural unit;

a gate of the thirteenth TFT receives the second GAS signal, a source of the thirteenth TFT receives the signal with the constant low-level potential, and a drain of the thirteenth TFT receives the current-stage gate driving signal of the Nth stage GOA structural unit.

9. A liquid crystal panel, comprising a GOA circuit comprising a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first thin film transistor (TFT), wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

10. The liquid crystal panel according to claim 9, wherein the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

11. The liquid crystal panel according to claim 10, wherein the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

12. The liquid crystal panel according to claim 11, wherein the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

13. The liquid crystal panel according to claim 12, wherein the node Q pull-down module comprises an eighth TFT, and a gate of the eighth TFT is connected to the second node, a source of the eighth TFT receives the signal with the constant low-level potential, and a drain of the eighth TFT is connected to the source of the first TFT of the voltage-stabilizing module and is connected to the first node through the first TFT.

14. The liquid crystal panel according to claim 13, wherein the node P pull-down module comprises a ninth TFT, and a gate of the ninth TFT is connected to both the drains of the second TFT and the third TFT of the forward-reverse scan control module, a source of the ninth TFT receives the signal with the constant low-level potential, and a drain of the ninth TFT is connected to the second node.

15. The liquid crystal panel according to claim 14, wherein the gate signal pull-down module comprises a tenth TFT, and a gate of the tenth TFT is connected to the second node, a source of the tenth TFT receives the signal with the constant low-level potential, and a drain of the tenth TFT receives the current-stage gate driving signal of the Nth stage GOA structural unit.

16. The liquid crystal panel according to claim 15, wherein the GAS signal function module comprises an eleventh TFT, a twelfth TFT and a thirteenth TFT; wherein, a gate of the eleventh TFT receives the first GAS signal, a source of the eleventh TFT receives the signal with the constant low-level potential, and a drain of the eleventh TFT is connected to the second node;

a gate of the twelfth TFT receives the first GAS signal and is short-connected to a source of the twelfth TFT, and a drain of the twelfth TFT receives the current-stage gate driving signal of the Nth stage GOA structural unit;

a gate of the thirteenth TFT receives the second GAS signal, a source of the thirteenth TFT receives the signal with the constant low-level potential, and a drain of the thirteenth TFT receives the current-stage gate driving signal of the Nth stage GOA structural unit.

17. A display device, comprising a liquid crystal panel comprising a GOA circuit; wherein, the GOA circuit comprises a plurality of GOA structural units connected in cascade, wherein each one stage of the GOA structural units outputs a line scanning signal to a corresponding one line of pixel units within a display area of a display panel in accordance with what is done by a Nth stage GOA structural unit of the GOA structural units; wherein, the Nth stage GOA structural unit comprises a forward-reverse scan control module for controlling the GOA circuit to scan forwardly or inversely by using a forward direct-current scan control signal and a reverse direct-current scan control signal; a node signal control input module for outputting a low-level potential in a non-working stage of the GOA circuit; an output control module for controlling output of a gate driving signal; a voltage-stabilizing module for maintaining a potential of a first node; a node Q pull-down module for pulling down the potential of the first node; a node P pull-down module for pulling down a potential of a second node; a gate signal pull-down module for pulling down a potential of a current-stage gate driving signal and controlling output of the current-stage gate driving signal during a scan period of a touch panel; a GAS signal function module for turning on all gate driving signals of the GOA circuit and controlling output of the current-stage gate driving signal during the scan period of the touch panel by using a first GAS signal and a second GAS signal; and a self-lifting capacitor for a second lifting of the potential of the first node, and N is a positive integer; wherein, the voltage-stabilizing module comprises a first thin film transistor (TFT), wherein a gate of the first TFT receives a third GAS signal, a source of the first TFT is connected to both the forward-reverse scan control module and the node Q pull-down module, and a drain of the first TFT is connected to the first node; wherein the third GAS signal is a signal with a constant high-level potential during the scan period of the touch panel, and is a signal with a constant low-level potential in a suspending period of the touch panel.

18. The display device according to claim 17, wherein the forward-reverse scan control module comprises a second TFT and a third TFT; wherein, a gate of the second TFT receives a current-stage gate driving signal of a (N−2)th stage GOA structural unit of the GOA structural units, a source of the second TFT receives the forward direct-current scan control signal, and a drain of the second TFT is connected to both the source of the first TFT of the voltage-stabilizing module and a drain of the third TFT;

a gate of the third TFT receives a current-stage gate driving signal of a (N+2)th stage GOA structural unit of the GOA structural units, and a source of the third TFT receives the reverse direct-current scan control signal.

19. The display device according to claim 18, wherein the node signal control input module comprises a fourth TFT, a fifth TFT and a sixth TFT; wherein, a gate of the fourth TFT receives the forward direct-current scan control signal, a source of the fourth TFT receives a current-stage clock signal of a (N+1)th stage GOA structural unit of the GOA structural units, and a drain of the fourth TFT is connected to a drain of the fifth TFT and a gate of the sixth TFT;

a gate of the fifth TFT receives the reverse direct-current scan control signal, and a source of the fifth TFT receives a current-stage clock signal of a (N−1)th stage GOA structural unit of the GOA structural units;

a source of the sixth TFT receives the signal with the constant high-level potential, and a drain of the sixth TFT is connected to the second node connected to the node Q pull-down module, the node P pull-down module, the gate signal pull-down module and the GAS signal function module.

20. The display device according to claim 19, wherein the output control module comprises a seventh TFT, and a gate of the seventh TFT is connected to the first node, a source of the seventh TFT receives a current-stage clock signal of the Nth stage GOA structural unit, and a drain of the seventh TFT receives the current-stage gate driving signal of the Nth stage GOA structural unit.

\* \* \* \* \*